US009622942B2

(12) United States Patent
Maijala et al.

(10) Patent No.: US 9,622,942 B2
(45) Date of Patent: Apr. 18, 2017

(54) SMART PACKAGE AND METHOD FOR MANUFACTURING THE PACKAGE

(75) Inventors: Juha Maijala, Espoo (FI); Raimo Mäkelä, Lohja (FI); Petri Ilkka, Nokia (FI)

(73) Assignee: STORA ENSO OYJ, Helsinki (FI)

( * ) Notice: Subject to any disclaimer, the term of this patent is extended or adjusted under 35 U.S.C. 154(b) by 636 days.

(21) Appl. No.: 13/985,511

(22) PCT Filed: Feb. 14, 2012

(86) PCT No.: PCT/FI2012/050142
§ 371 (c)(1),
(2), (4) Date: Oct. 28, 2013

(87) PCT Pub. No.: WO2012/110701
PCT Pub. Date: Aug. 23, 2012

(65) Prior Publication Data
US 2014/0048442 A1   Feb. 20, 2014

(30) Foreign Application Priority Data
Feb. 15, 2011   (FI) ...................................... 20115144

(51) Int. Cl.
*B65D 83/04*   (2006.01)
*A61J 7/04*   (2006.01)
(Continued)

(52) U.S. Cl.
CPC . *A61J 7/04* (2013.01); *A61J 1/03* (2013.01); *A61J 1/035* (2013.01); *A61J 7/0436* (2015.05);
(Continued)

(58) Field of Classification Search
CPC .. B65D 75/327; B65D 83/04; B65D 2203/00; A61J 1/035; A61J 7/0481; A61J 2200/30;
(Continued)

(56) References Cited

U.S. PATENT DOCUMENTS 4,526,474 A * 7/1985 Simon ................... A61J 7/0481
206/534
4,617,557 A * 10/1986 Gordon ..................... A61J 7/04
206/531
(Continued)

FOREIGN PATENT DOCUMENTS

CA          2353350 A1    1/2003
WO    WO 2004/028438 A2    4/2004
(Continued)

OTHER PUBLICATIONS

International Search Report for PCT/FI2012/050142 mailed on Jun. 18, 2012.
(Continued)

*Primary Examiner* — Luan K Bui
(74) *Attorney, Agent, or Firm* — Birch, Stewart, Kolach & Birch, LLP

(57) ABSTRACT

A smart package backing (100) for pills removable from the backing, wherein the backing is adapted to record a removal of said pills by means of detection elements (103, 401a, 501a). The detection elements comprise electrical components (401a, 501a), wherein said electrical components are pressed onto the backing (100) with methods of printing technology. The removal of a pill from the backing is adapted to bring about a structural change in at least one printed component, and the structural change of said component is adapted to bring about an electrically measurable change in an electric circuit comprising said component. In addition, at least one of said electrical components (401a, 501a) deviates in terms of its specific electrical value from the specific electrical value of at least one other electrical component (401a, 501a).

18 Claims, 3 Drawing Sheets

(51) Int. Cl.
  *B65D 75/32* (2006.01)
  *A61J 1/03* (2006.01)
  *H05K 1/02* (2006.01)

(52) U.S. Cl.
  CPC .......... *A61J 7/0481* (2013.01); *B65D 75/327* (2013.01); *B65D 83/04* (2013.01); *A61J 7/0418* (2015.05); *A61J 2205/60* (2013.01); *A61J 2205/70* (2013.01); *B65D 2203/00* (2013.01); *H05K 1/0275* (2013.01); *Y10T 29/49124* (2015.01)

(58) Field of Classification Search
  CPC ............. H05K 3/005; H05K 2203/162; H05K 2203/175; H05K 1/167
  USPC .................. 206/528, 531, 534, 540; 29/829; 340/309.7, 568.1; 368/10, 12; 53/467, 53/473
  See application file for complete search history.

(56) References Cited

U.S. PATENT DOCUMENTS

| | | | | |
|---|---|---|---|---|
| 5,181,189 | A * | 1/1993 | Hafner | A61J 7/0481 206/534 |
| 5,412,372 | A * | 5/1995 | Parkhurst | G06F 19/3462 368/10 |
| 5,836,474 | A * | 11/1998 | Wessberg | A61J 7/0481 221/2 |
| 5,871,831 | A * | 2/1999 | Zeiter | A61J 7/0481 206/531 |
| 6,244,462 | B1 * | 6/2001 | Ehrensvard | A61J 1/035 221/25 |
| 6,411,567 | B1 * | 6/2002 | Niemiec | A61J 7/0481 368/10 |
| 6,628,199 | B1 | 9/2003 | Ehrensvärd et al. | |
| 6,961,285 | B2 * | 11/2005 | Niemiec | A61B 5/0002 206/531 |
| 6,973,371 | B1 * | 12/2005 | Benouali | A61J 1/035 221/15 |
| 7,170,409 | B2 | 1/2007 | Ehrensvärd et al. | |
| 7,178,417 | B2 | 2/2007 | Petersen et al. | |
| 7,336,564 | B2 * | 2/2008 | Feodoroff | A61J 7/0481 206/534 |
| 7,475,784 | B2 * | 1/2009 | Simon | A61J 1/035 206/528 |
| 7,489,594 | B2 * | 2/2009 | Simon | A61J 1/035 206/531 |
| 7,552,824 | B2 * | 6/2009 | Le | A61J 7/0481 206/531 |
| 7,726,485 | B2 * | 6/2010 | Brollier | A61J 1/035 206/532 |
| 7,878,367 | B2 * | 2/2011 | Simon | A61J 7/0481 206/531 |
| 8,151,990 | B2 * | 4/2012 | Udo | A61J 1/035 206/531 |
| 2003/0111477 | A1 * | 6/2003 | Niemiec | A61J 7/0481 221/2 |
| 2004/0178112 | A1 * | 9/2004 | Snyder | A61J 7/0481 206/534 |
| 2005/0122219 | A1 * | 6/2005 | Petersen | A61J 1/035 340/568.1 |
| 2005/0162979 | A1 | 7/2005 | Ostergaard et al. | |
| 2005/0241983 | A1 * | 11/2005 | Snyder | A61J 7/0481 206/539 |
| 2009/0277815 | A1 * | 11/2009 | Kohl | A61J 1/035 206/531 |
| 2010/0089789 | A1 * | 4/2010 | Rosenbaum | A61J 1/035 206/531 |
| 2010/0089791 | A1 | 4/2010 | Rosenbaum et al. | |

FOREIGN PATENT DOCUMENTS

| | | |
|---|---|---|
| WO | WO 2007/043858 A2 | 4/2007 |
| WO | WO 2010/108838 A1 | 9/2010 |

OTHER PUBLICATIONS

Written Opinion of the International Searching Authority PCT/FI2012/050142 mailed on Jun. 18, 2012.

* cited by examiner

SMART PACKAGE AND METHOD FOR MANUFACTURING THE PACKAGE

The invention relates to a smart package and a method for manufacturing such a package.

PRIOR ART

The prior art discloses various smart packages, such as for example medication packages, wherein the use of medicines is monitored with various methods. For example, the publication CA 2353350 presents a so-called smart medication package, wherein for each medical pill in the package there is a corresponding electrically conducting path. A removal of medication causes a failure of the conductor, which is detected by means of a microcircuit.

However, such solutions involve certain problems or drawbacks. One downside, among others, is the employment of quite complicated microcircuits for detecting the use of medicines. For example, a medication package, which contains 12 pills, requires a microcircuit or another equivalent I/O controller with no less than 13 I/O buses. The complicated circuits are relatively bulky, expensive, and have high power consumption.

SUMMARY

One objective of the invention is to eliminate or at least alleviate drawbacks related to the prior art. According to one embodiment, the invention pursues to find a solution as to how the detection of removable objects from a smart package could be implemented with a circuit comprising just a few I/O ports. The invention also pursues to find a solution as to how said smart package could be manufactured quickly, cost efficiently, as well as in an environmentally sound manner, yet maintaining its operating reliability.

Some objectives of the invention are attained by a backing of claim 1 suitable for a smart package.

The backing of the invention suitable for a smart package is directed to a backing. The smart package of the invention is directed to a smart package, and the method for manufacturing a backing suitable for a smart package, or for manufacturing a smart package.

The invention concerns a backing, which is intended for objects removable from the backing, such as for example for medication pills or tablets, and in which the backing is adapted to record a removal of said objects by means of detection elements provided in the backing. According to one embodiment of the invention, the detection elements comprise electrical components, which are most preferably pressed on the backing by methods of printing technology. The removal of an object from the backing is adapted to bring about a structural change in at least one printed component, such that the change produces an electrically measurable change in at least one of said electrical components printed on the backing. According to one preferred embodiment of the invention, said electrical components are selected or fabricated (for example pressed directly on said backing) in such a way that at least one of said electrical components deviates in terms of its specific electrical value from the specific electrical value of at least one other electrical component.

The components can be any components capable of being pressed on a backing by methods of printing technology, such as for example resistors, capacitors and/or switches. According to one particularly preferred embodiment of the invention, said components are produced by methods of printing technology, such as for example by printing. Printing is preferably conducted by using some printable electrical conductor, such as at least partially conductive ink, carbon black, silver ink, aluminum foil, and/or silver paste. The components' specific electrical values, such as resistance or capacitance, can be made different from each other by using for example unequal layers of printable electrical conductor in the process of printing said components.

According to one embodiment of the invention, the specific electrical values, such as resistance or capacitance, of components printed on the backing are set to be different from each other, whereby, for example upon breaking a given component of the circuit, this particular component can be identified by determining the magnitude of change in an electrical property of the circuit. For example, when the circuit consists of two parallel connected resistors, for example 4 k$\Omega$ and 8 k$\Omega$, the eliminated resistor can be identified in quite a simple manner based on a change in the circuit's total resistance. Since each given component has a corresponding content unit, it is possible to identify a content unit on the basis of an electrical change brought about by a structural change in the component corresponding to that particular content unit.

According to one embodiment, the components are connected in parallel. According to another embodiment, at least some of the components can also be connected in series. In addition, according to one embodiment, alongside with some series-connected components can further be connected one component in parallel. According to one example of the invention, at least two components with different specific electrical values can share a common operating voltage line and earth line. According to one example, the arrangement may be such that the backing has at least two electrical lines, with at least two lines thereof comprising at least two parallel electrical components, whereby said lines can be electrically read separately from each other.

According to one embodiment of the invention, the line with a plurality of parallel components can be electrically balanced by means of an electrical component included in the backing, for example before removing a single content unit from the backing. This enables minimizing the significance of the absolute values of electrical components, for example resistors, especially if the ratios of inter-component values remain the same. Thus, in the case of resistors, the removal of a content unit can be measured for example as a voltage deviation from the balanced bridge.

According to one example, the components are organized in lines. When the components of a line are resistors, the removal of an object can be detected as a voltage deviation in this particular line caused by a change in the resistance of a resistor included in the discussed line. The components may also be capacitors, whereby the removal of an object can be detected as a change in the charging or discharging time in this particular capacitor line, said change being caused by a change in the capacitance of a capacitor included in the discussed line as said line is being charged or discharged with electric current.

According to one embodiment, the above-mentioned resistor or capacitor may constitute a part of some other electrical circuit of the backing, such as for example an oscillator, whereby a change in resistance or capacitance can be detected as a change in the oscillator's frequency. The components can be set up in such a way that the change in frequency can be used to conclude the type of a change-producing component (resistor or capacitor) and the magnitude of its specific value, on the basis of which said component, and thereby the removed content unit corresponding to the component, can be determined.

The backing according to the invention comprises preferably also a power source for supplying electric power to said components. In addition, it comprises a data processing medium, such as a microcircuit, for measuring electrical changes in the backing. Said data processing medium can be adapted to identify said removed object on the basis of a unique electrical change in one of the electrical lines or circuits of said backing, said change being produced by said removed object, as described elsewhere in this document.

It should be noted that the backing may further comprise also data transfer media, most preferably wireless data transfer media, such as for example a mobile communication system module, for conveying information related to said removal of an object outside said backing, preferably by way of a mobile communication network. The module can be for example a GSM, CPRS or UMTS module or some other data transfer module, which is capable of operating in a mobile communication network and which comprises also more recent data transfer technologies, such as 3G and 4G techniques. Alternatively or additionally, the backing may feature a data transfer solution based on short-range RF technique, such as RFID or NFC technique, as well as also a wired data transfer medium, such as a USB interface. It should further be noted that the backing is most preferably a fiber- or plastic-based backing, comprising cardboard or paper or the like fiber-based material.

It should specifically be noted that, according to one preferred embodiment, the backing comprises a docking element for docking said data transfer media to the backing for example for the duration of a medication package use, whereby, after the medication package use, the data transfer media can be disengaged from the package for connecting the same to a new package and the spent package can be recycled, for example along with recyclable cardboard, or incinerated. The docking element can be manufactured from the same recyclable and environmentally sound material as the backing, and its conductor lines can be fabricated with the same methods of printing technology as used in the printing of other backing components.

The above-mentioned backing enables the detection of removable objects and even the identification of a removed object, with a circuit comprising just a few I/O ports. In addition, the use of printing technology for the fabrication of components enables carrying out the fabrication process in a high speed and cost efficient manner, because the components are pressed directly onto said backing, nor are any special arrangements necessary for attaching, such as gluing, a separate circuit or device with the components for example to the bottom structure of a medication package. Furthermore, the method provides a highly ecological, yet reliably operating fabrication process for components and a backing, because the components can be constructed by using for example environmentally friendly carbon black. Most preferably, the data transfer medium, such as a mobile communication module, is attached removably to a backing by way of a docking station included in the backing, whereby the removable module enables producing a package that is recyclable and environmentally friendly.

DESCRIPTION OF FIGURES

Preferred embodiments of the invention will be described in the following segment a little more precisely with reference to the accompanying figures, in which FIG. 7 shows, according to one preferred embodiment of the invention, one exemplary backing implemented with capacitors.

DETAILED DESCRIPTION OF FIGURES

Figure 1:
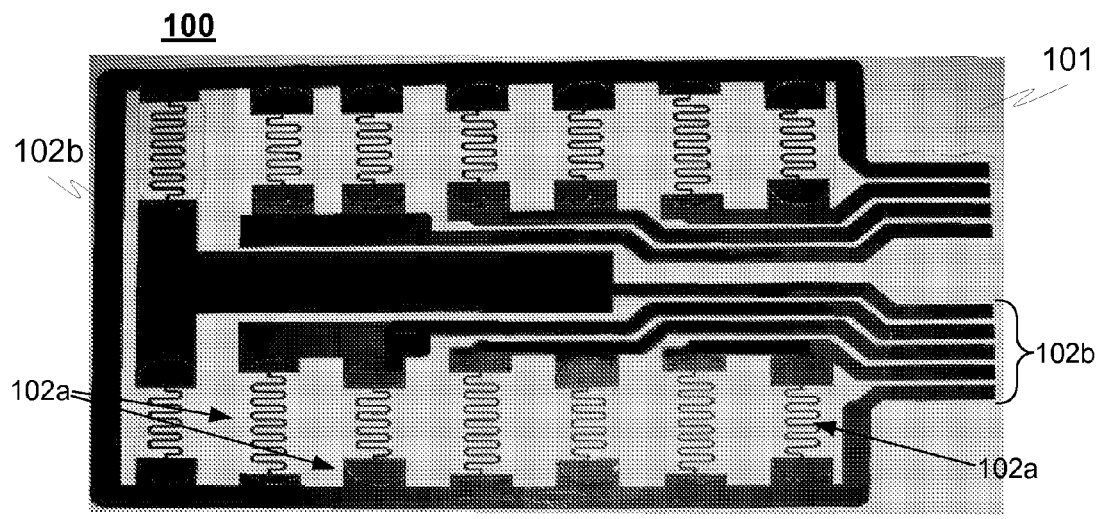
FIG. 1 shows, according to one preferred embodiment of the invention, one exemplary backing.

FIG. 1 shows one exemplary backing 100 according to one preferred embodiment of the invention, wherein components 102 are pressed by methods of printing technology on a fiber-based, most preferably board-containing backing 101. The components 102 comprise a segment 102a pressed in alignment with each pill, as well as a conductor line segment 102b pressed on the backing 101. It should be noted that, when the components are resistors, each component's inherent specific electrical value or resistance can be made different from that of another component.

For example, in the backing of FIG. 1, a single conductor line 102b is shown to include segments 102a designated for two pills, whereby the different resistances have been established by printing the conductor line segment 102b in such a way that at least a part of the otherwise common conductor line segment extending to a first pill is, in terms of its resistance, different from the conductor line segment extending to a second pill in the same conductor line. In order to provide a reliable measurement, the resistances of conductor segments must deviate sufficiently from each other. Said resistance differences can be attained for example by providing the conductor lines or conductor line segments with unequal cross-sectional areas, whereby the conductor segment with a larger cross-sectional area is more conductive, in other words its resistance is lower than that of the conductor segment with a smaller cross-sectional area. Alternatively or additionally, the resistance of a segment 102a pressed in line with a pill can also be impacted in a similar manner. For example, a long segment 102a establishes a higher resistance than a short segment 102a.

Figure 2:
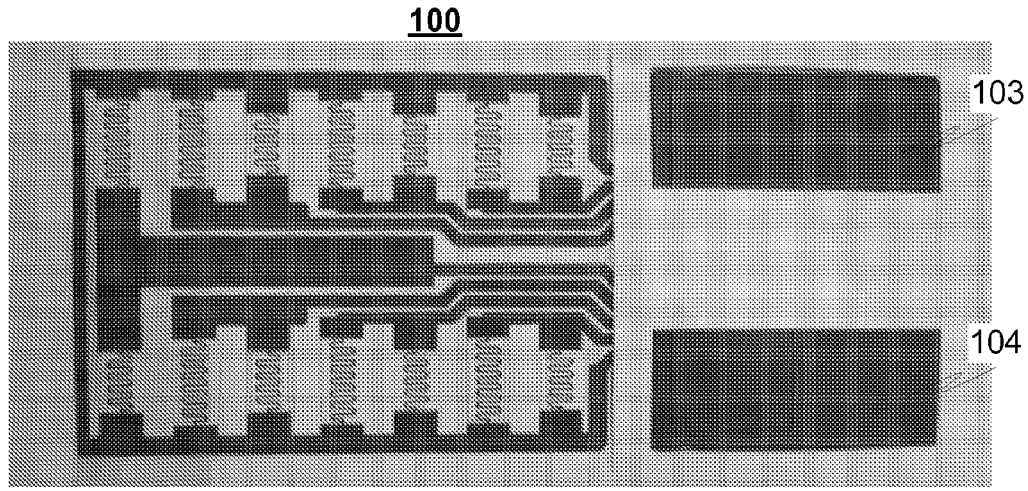
FIG. 2 shows, according to one preferred embodiment of the invention, one exemplary outfitted backing.
Figure 3:
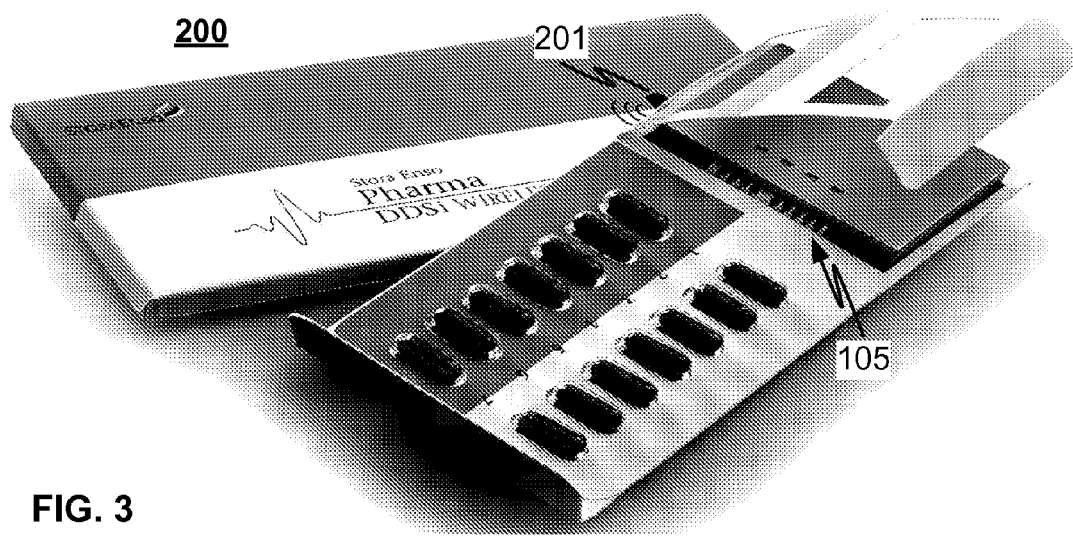
FIG. 3 shows, according to one preferred embodiment of the invention, one exemplary smart package provided with a backing.
Figure 4:
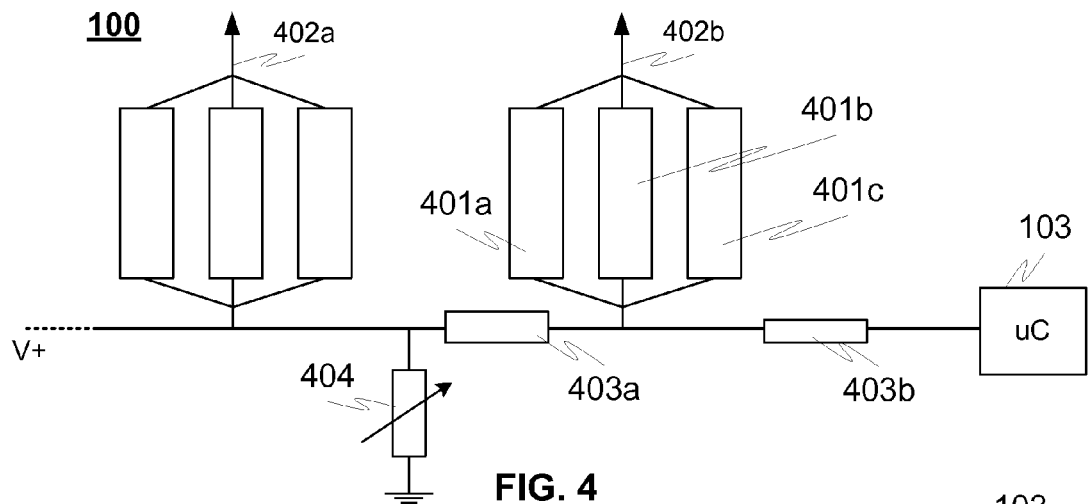
FIG. 4 shows, according to one preferred embodiment of the invention, one exemplary backing implemented with resistors.

It should be noted that the number of segments 102a printed in line with pills along a single conductor line 102b can be more than the two depicted in FIG. 1. The number of printed segments 102a included in a single conductor line 102b is influenced, among other things, by the sensitivity of a reading circuit. One such reading circuit 103 is depicted in FIG. 2. The outfitted backing 100 shown in FIG. 2 may further comprise also a power source 104. The backing 100, or a smart package 200 with a backing as shown in FIG. 4, may also further comprise a docking station 105 consisting of printed conductors and a fiber material, to which a module functional in a mobile communication network, for example a GSM module or the like, can be connected in a removable manner. The backing 100, or the smart package 200 shown in FIG. 3, may also comprise an attention getter 201, such as a led component or a sound producing element, for example for delivering a reminder to the user regarding the smart package content use at a prescribed time.

Figure 5:
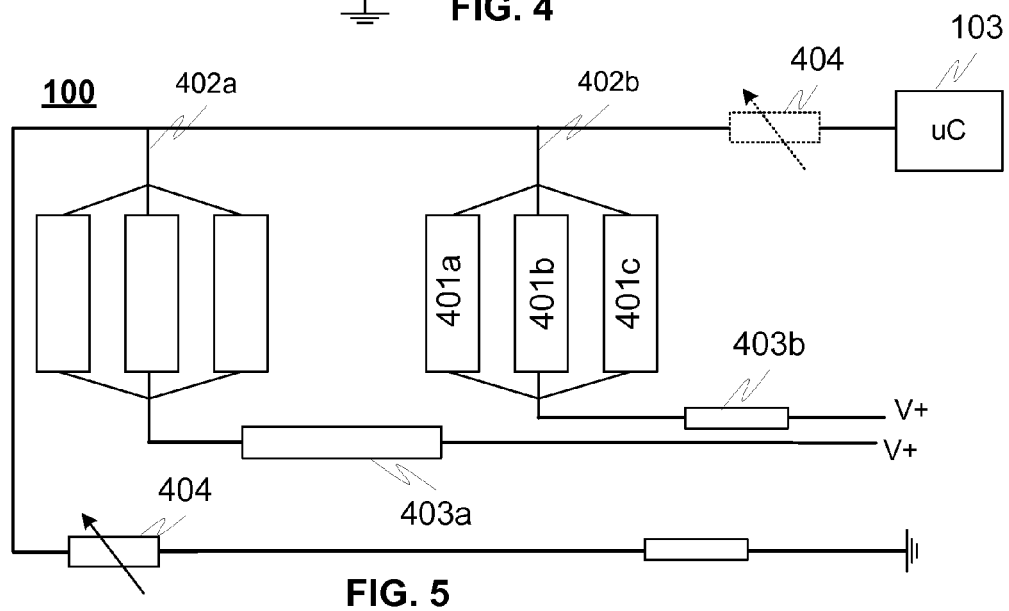
FIG. 5 shows, according to one preferred embodiment of the invention, a second exemplary backing implemented with resistors.
Figure 6:
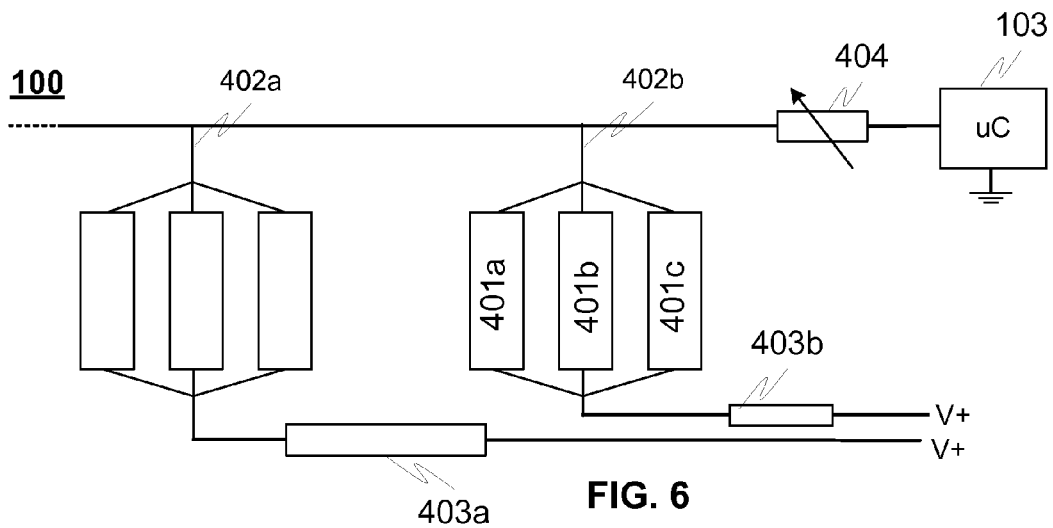
FIG. 6 shows, according to one preferred embodiment of the invention, a third exemplary backing implemented with resistors.

FIGS. 4-6 show, according to one preferred embodiment of the invention, a few exemplary backings 100 implemented with resistors 401, wherein each resistor 401a, 401b, 401c in FIG. 4 corresponds to a single content unit, for example a pill, intended to be removed from the backing. In other words, each pill is matched by one resistor and these are set in parallel connection. Most preferably, the resistors are placed in parallel, for example in pairs or in groups of three as shown in the figure, which still results in a highly reliable measurement. According to one strictly exemplary embodiment, the conductor lines, and the printed segments 102a included therein, can be arranged for example in such a way that, for a first pill, the total resistance value of a conductor line 102b and a printed segment 102a applied thereto will be for example 3 kΩ, for a second pill it will be 6 kΩ, and for a third pill 9 kΩ. It should be noted that these specific values are given just by way of example and other resistance values can of course be used just as well.

According to one embodiment, the resistors present in a common line 402a, 402b are mutually different in terms of their resistances in order to enable the identification thereof in any sequence. According to one embodiment, every conductor line 102b arriving at the reading circuit 103 can be measured separately, whereby the resistors present in various conductor lines 102b can be substantially equal in terms of their resistances, thus avoiding the need to print such a large number of unequal resistors and making the printing process e.g. simpler and faster.

It should further be noted that the lines 402a, 402b can be distinguished from each other by dimensioning and fabricating their line resistors 403a, 403b to be sufficiently different from each other. It should still further be noted that the backings 100 also enable the use of adjustable components 404, preferably resistors, by means of which a current circuit, for example a resistance bridge established by the components, can be balanced or stabilized before the backing is used or before removing a single pill therefrom. Hence, for example the significance of the absolute values of resistors can be minimized, especially if the ratios of the components' specific electrical values remain unchanged.

In the arrangement of FIGS. 4 and 5, the removal of a pill can be determined and especially the identification of a removed pill can be performed for example as a voltage deviation from the bridge balance, because the magnitude of a voltage deviation is proportional to a change in the magnitude of resistance. In the arrangement of FIG. 6, the removal of a pill can be determined and especially the identification of a removed pill can be performed for example by using a reading circuit 103 to measure a change of current in the electric circuit. A current measurement can be conducted with the reading circuit 103 for example by charging or discharging a capacitor present in the electric circuit (not shown, but said capacitor is arranged to be a part of the electric circuits of all conductor lines 402a, 402b) and by measuring the time spent for charging or discharging, said time being proportional to a change in the magnitude of resistance in said electric circuit. In the arrangement of FIG. 5, the adjustable resistor 404 can be used for adjusting the total resistances of various lines 402a, 402b for example to an equal level, such that changes in the resistances of resistors 401a, 401b, 401c, which correspond to the pills, have a similar effect on electric current in each line 402a, 402b.

FIG. 7 shows, according to one preferred embodiment of the invention, one exemplary backing 100 implemented with capacitors 501a, 501b, 501c, wherein the backing is otherwise highly analogous to those implemented with resistors and shown in FIGS. 4-6, except that the backing 100 of FIG. 7 has resistors replaced with capacitors.

In the arrangement of FIG. 7, the removal of a pill can be determined and especially the identification of a removed pill can be performed for example by using a reading circuit 103 to measure a change of current in the electric circuit provided with capacitors. A current measurement with the reading circuit 103 can be conducted for example by charging or discharging some other capacitor present in the electric circuit than a capacitor 501a, 501b, 501c corresponding to the pill (not shown, but said capacitor is arranged to be a part of the electric circuits of all conductor lines 502a, 502b) and by measuring the time spent for charging or discharging, said time being proportional to a change in the magnitude of capacitance in said electric circuit. In the arrangement of FIG. 7, the adjustable resistor 404 can be used for adjusting the total resistances of various lines 502a, 502b for example to an equal level, such that changes in the capacitances of capacitors 501a, 501b, 501c, which correspond to the pills, have a similar effect on electric current in each line 402a, 402b. In other words, it is an objective to adjust total resistances of the lines to be substantially equal to each other or otherwise in such a way that the current used for charging and discharging the capacitor of each line is essentially constant in each line. Hence, by comparing charging and/or discharging times, it is possible to conclude the capacitance of a line and, on the basis of changes occurring in the times, the magnitude of change in capacitance and thereby the removed content unit.

Figure 8:
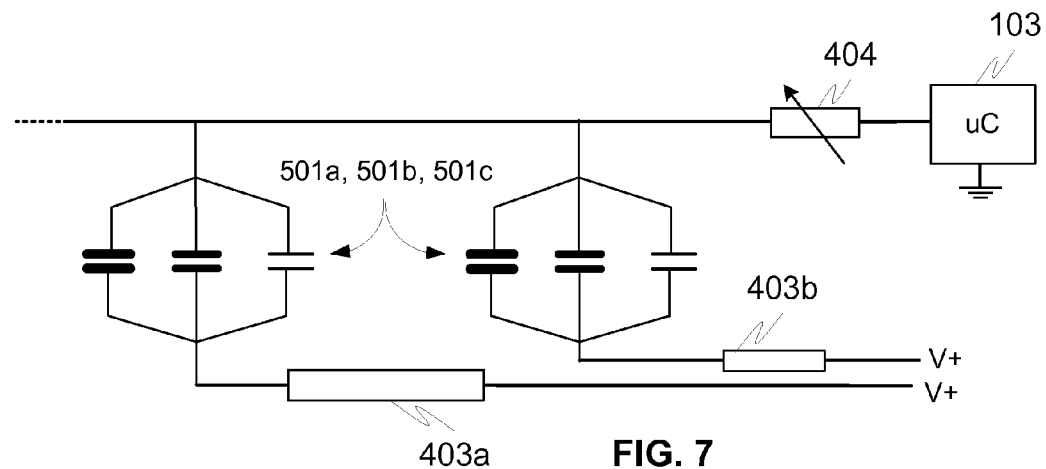
FIG. 8 shows, according to one preferred embodiment of the invention, one exemplary backing implemented with resistors and switches.
Figure 9:
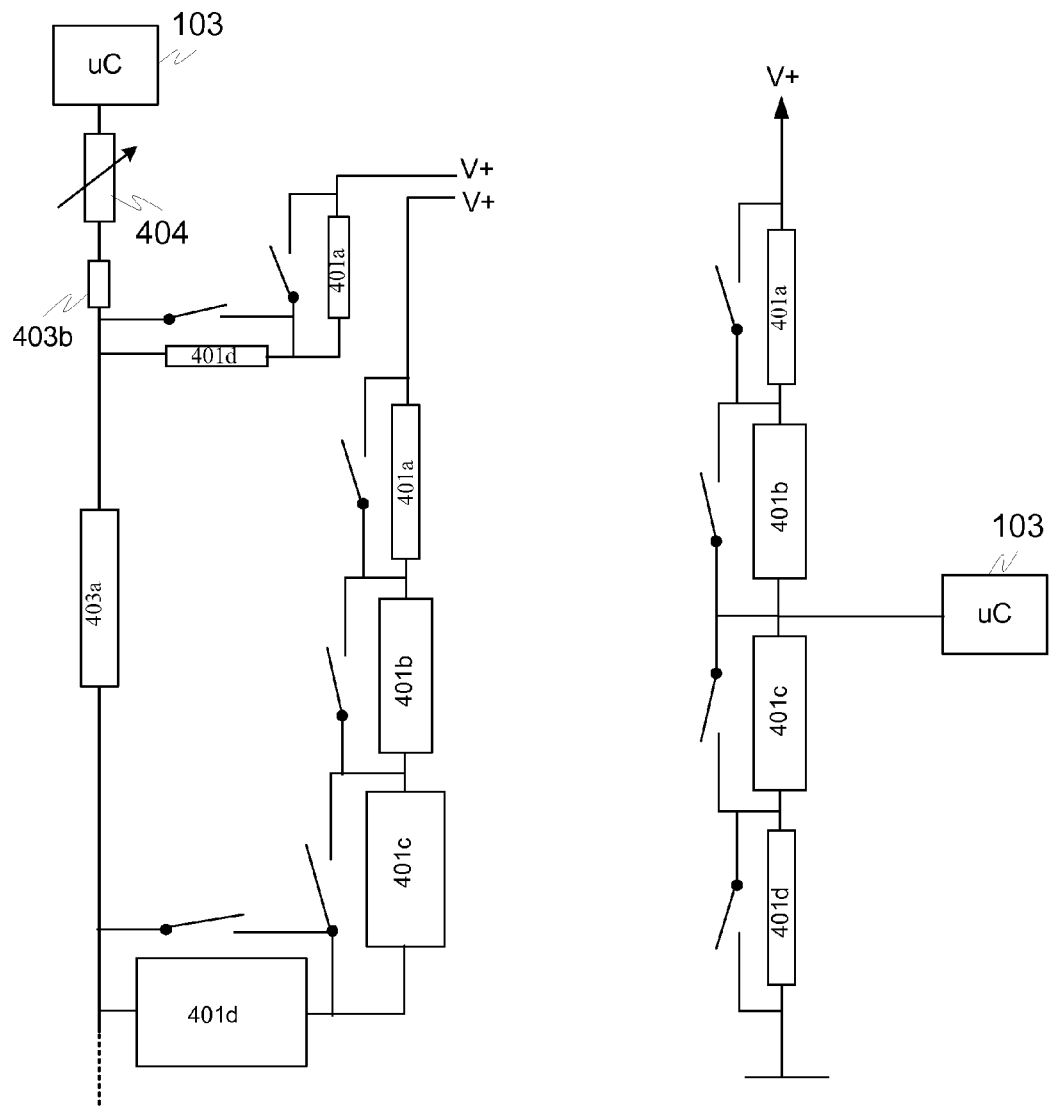
FIG. 9 shows, according to one preferred embodiment of the invention, a second exemplary backing implemented with resistors and switches.

FIGS. 8 and 9 show, according to a few preferred embodiments of the invention, some exemplary backings 100 implemented with resistors 401a, 401b, 401c, 401d and with switches 801a, 801b, 801c, 801d complementary thereto, wherein for example the unequal resistors 401a, 401b, 401c, 401d present in series are initially short-circuited with the switches 801a, 801b, 801c, 801d. Each resistor is matched most preferably by at least one switch. The switch may most preferably be a short-circuit conductor, which is fabricated by way of printing technology and which cuts off or otherwise breaks as a content unit is removed from the backing. When the short-circuit switch breaks up, the short circuit matching this particular short-circuit switch also disappears and all that remains in this section as a part of the electric circuit is a resistor, which corresponds to the particular broken short-circuit switch and which is perceived in the electric circuit as a resistor-specific resistance increase.

In the arrangement shown for example in FIG. 8, the magnitude of resistance increase can be determined for example by measuring a current proceeding through the electric circuit. Respectively, in the arrangement (resistance bridge) shown in FIG. 9, the magnitude of resistance increase can be determined for example by measuring a voltage distribution of the resistance bridge and to conclude on that basis the broken short-circuit switch and to identify a removed pill corresponding thereto.

It should be noted that the resistors or capacitors (capacitors especially in FIG. 7, but also resistances in other figures) included in backings shown in the above-described figures may also constitute part of an oscillator (not shown in the figures) present on the reading circuit 103, whereby changes in resistance or capacitance (depending on whether the electrical components employed in the backing are resistors or capacitors) are detected as changes in the oscillator's frequency. A change in the oscillator's frequency is proportional to the magnitude of a change in the changed resistance or capacitance of an electric circuit, whereby the change of frequency can be used to conclude the change-producing resistor or capacitor and thereby the removed pill corresponding thereto.

Described above are just a few embodiments for a solution of the invention. The principle according to the invention can naturally be varied within the scope of protection defined by the claims, for example in terms of implementation details as well as fields of use. It should be noted that the number of electrical components may vary and, for example, both the resistors, capacitors and the switches may appear in variations different from those depicted in the figures. It should particularly be noted that, also in a backing implemented with capacitors, the capacitors can be initially short-circuited in a similar way as the resistors in FIGS. 8 and 9, whereby the disappearance of this short circuit changes the capacitance of the discussed electric circuit.

It should further be noted that the smart package of the invention can be for example a medication package, but also some other similar type package employing a backing of the invention. Such other smart packages may include for example backings and packages or shipping pallets intended for shipping and/or storing singular items, such as yogurt containers or other one-by-one removable content units, whereby the embodiments according to the invention enable also carrying out inventory bookkeeping. The smart package of the invention used for storage, for example a storage pallet or the like, may comprise a plurality of singularly packed content units and may notify for example the accountant, by way of communication media, of a removal of content units, the number of such units, or that the smart package, i.e. in this case a storage pallet, is running out of such units.

The backing can be for example a fiber-based layer, which is for example the bottom layer or part of the bottom layer of a smart package, such as a medication package or the like. According to one embodiment, the smart package is a blister package, wherein every blister comprises for example a single medicine or a dose of medicine and wherein the blisters are arranged relative to the backing in such a way that every blister is matched by at least one printed electrical component described in this document. The removal of a medicine is most preferably conducted by pressing the blister, whereby the medicine forces itself through the backing layer and at the same time changes the structure of a corresponding component, such as for example breaks the component's electric circuit. According to a second example, the backing can be for example a backing, which is made of cardboard or some other appropriate material and which is intended for shipping and/or storing content units, such as for example a package intended for carrying yogurt containers, beverage cans or the like.

It should be noted that numerous applications of the invention have been described in reference to fiber- or plastic-based packages. In one exemplary application, the fiber- or plastic-based package material comprises cardboard. Alternatively, the fiber- or plastic-based package material may also comprise paper or the like. As an option to fiber, one application of the invention may also involve the use of plastics, polymer films or the like. With regard to exemplary applications of the invention, it should indeed be noted that the fiber or plastics may refer at least to the former and equivalents thereof. Hence, a functional backing can be obtained by using almost any insulating and flat blank, fiber, fibrous mesh, textile, wallpaper, coating, biomaterial, ceramic coaster, glass, aluminum foil, etc. The backing can be coated or uncoated, as well as it can be wood-based or not wood-based. Thus, every substrate has its inherent pros and cons, regarding and relating to the desired package. Regarding its temperature, the substrate can be for example such that the melting or reshaping point withstands temperatures of 200° C., especially temperatures less than 250° C. or preferably less than 300° C. According to one embodiment, the smart package or the backing can be a blister package in itself, such as for example an aluminum foil coated with plastics or the like, the components having been pressed or printed for example by inkjet technique.

The invention claimed is:

1. A backing comprising a plurality of objects removable from the backing, wherein the backing further comprises detection elements, the detection elements comprising a plurality of printed electrical components and detection means adapted to record a removal of an object of said plurality of objects, and wherein said printed electrical components are pressed onto the backing with methods of printing technology, and wherein the removal of the object of said plurality of objects from the backing brings about a structural change including a cut off or break in at least one printed electrical component of said plurality of printed electrical components, and wherein the structural change of said printed electrical component brings about an electrically measurable change in an electric circuit comprising said printed electrical component, and further wherein at least one of said plurality of printed electrical components deviates in terms of its specific electrical value from the specific electrical value of at least one other printed electrical component of said plurality of printed electrical components, wherein the backing further comprises a wireless data transfer module operable in a mobile communication system for delivering information relating to a removal of said object of the plurality of objects outside the backing responsive to detecting the removal of said object of the plurality of objects without user input.

2. A backing according to claim 1, wherein said printed electrical components are resistors, capacitors, switches, and/or conductor lines connecting the same.

3. A backing according to claim 1, wherein specific electrical values of at least two printed electrical components present in the backing, resistance or capacitance, are made by methods of printing technology different from each other, wherein the object of the plurality of objects causing the structural change of a particular printed electrical component is identified on the basis of a change in the specific electrical value inherent to said printed electrical component.

4. A backing according to claim 1, wherein at least two printed electrical components with different specific electrical values share a common operating voltage line and earth line.

5. A backing according to claim 1, wherein the backing comprises at least two electrical lines, said at least two electrical lines comprising at least two parallel electrical components.

6. A backing according to claim 5, wherein said lines are electrically read separately from each other.

7. A backing according to claim 1, wherein a line with several parallel components is electrically balanced by means of an adjustable electrical component present in the backing.

8. A backing according to claim 1, wherein for each object to be removed from the backing is provided at least one printed electrical component.

9. A backing according to claim 1, wherein, in a case where the printed electrical components of a line are resistors, the detection of removal of the object of a plurality of objects is implemented as a measurement of the voltage deviation in said line caused by a change in the resistance of a resistor present in the discussed line, or as a measurement of the electrical change caused by said change in the resistance of a resistor in another electric circuit of the backing, as a change in the frequency of an oscillator.

10. A backing according to claim 1, wherein, in a case where the printed electrical components of at least one line are capacitors, the detection of removal of the object of a plurality of objects is implemented as a change of charging or discharging time in the capacitor line caused by a change in the capacitance of a capacitor present in the line upon charging or discharging it with electric current, or as a measurement of the electrical change caused by said change in the capacitance of a capacitor in another electric circuit of the backing, as a change in the frequency of an oscillator.

11. A backing according to claim 1, wherein at least one line comprises printed electrical components in series, resistors or capacitors different from each other in terms of their specific electrical values, and in addition to these, switches short-circuiting or opening said printed electrical components in such a way that a removal of said object of the plurality of objects breaks said switch-inflicted short circuit, producing thereby a change of resistance or capacitance in said line proportional to the specific electrical value of this particular short-circuited component.

12. A backing according to claim 1, wherein electrical lines and said printed electrical components are implemented with methods of printing technology by using a printable electrical conductor, at least partially conductive ink, carbon black, silver black, aluminum foil, and/or silver paste.

13. A backing according to claim 1, wherein the backing comprises a power source for supplying electric power to said printed electrical components, a data processing medium, and a microcircuit, for measuring electrical changes in the backing, and wherein said data processing medium identifies said removed object of the plurality of objects on the basis of an individual electrical change produced by said removed object of the plurality of objects in any electrical line or circuit of said backing.

14. A backing according to claim 1, wherein the wireless data transfer module comprises data transfer elements, including one of wireless data transfer elements, a mobile communication system module, a GSM, GPRS or UMTS module, for delivering information relating to a removal of said object of the plurality of objects outside the backing, most preferably by way of a mobile communication network.

15. A backing according to claim 1, wherein the backing is a fiber- or plastic-based backing, comprising cardboard or paper or the like fiber-based material, or a blister package, wherein the blister package is coated with an aluminum foil on which said printed electrical components are pressed or printed by inkjet technique.

16. A smart package, a medication package or a smart package intended for shipping or storing single-unit contents, wherein the package comprises a backing comprising a plurality of objects removable from the backing, wherein the backing further comprises detection elements, the detection elements comprising a plurality of printed electrical components and detection means records a removal of said objects of said plurality of objects, and wherein said printed electrical components have been pressed onto the backing with methods of printing technology, and wherein the removal of an object of said plurality of objects from the backing brings about a structural change including a cut off or break in at least one printed electrical component of said plurality of printed electrical components, and wherein the structural change of said printed electrical component brings about an electrically measurable change in an electric circuit comprising said printed electrical component, and further wherein at least one of said plurality of printed electrical components deviates in terms of its specific electrical value from the specific electrical value of at least one other printed electrical component of said plurality of printed electrical components, wherein the backing further comprises a wireless data transfer module operable in a mobile communication system for delivering information relating to a removal of said object of said plurality of objects outside the backing responsive to detecting the removal of said object of the plurality of objects without user input.

17. A method for manufacturing a backing comprising a plurality of objects removable from the backing or a smart package comprising said backing wherein the backing further comprises detection elements, the detection elements comprising a plurality of printed electrical components and detection means records a removal of said objects, in which method, said printed electrical components present in detection elements included in the backing are pressed onto the backing by methods of printing technology, such that the removal of an object of said plurality of objects from the backing brings about a structural change including a cut off or break in at least one printed electrical component of said plurality of printed electrical components, and wherein the structural change of said printed electrical component brings an electrically measurable change in an electric circuit comprising said printed electrical component, and further wherein at least one of said plurality of printed electrical components deviates in terms of its specific electrical value from the specific electrical value of at least one other printed electrical component of said plurality of printed electrical components, wherein the backing further comprises a wireless data transfer module operable in a mobile communication system for delivering information relating to a removal of said object of said plurality of objects outside the backing responsive to detecting the removal of said object of the plurality of objects without user input.

18. A method according to claim 17, wherein the specific electrical value, resistance or capacitance, of at least two printed electrical components are fabricated by methods of printing technology to be different from each other by printing said printed electrical components from unequal layers of printable electrical conductor, wherein the object producing a structural change in a particular component is identifiable on the basis of a change in the specific electrical value inherent to said printed electrical component.

* * * * *